United States Patent
Lin

(10) Patent No.: US 6,277,757 B1
(45) Date of Patent: Aug. 21, 2001

(54) METHODS TO MODIFY WET BY DRY ETCHED VIA PROFILE

(75) Inventor: Chi-Fa Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/323,753

(22) Filed: Jun. 1, 1999

(51) Int. Cl.$^7$ .................................................. H01L 21/302
(52) U.S. Cl. ........................ 438/704; 438/706; 438/723; 438/724; 438/745; 438/756; 438/757
(58) Field of Search .................................... 438/704, 706, 438/723, 724, 745, 756, 757, 729

(56) References Cited

U.S. PATENT DOCUMENTS

| | | | |
|---|---|---|---|
| 5,219,791 | * 6/1993 | Freiberger | 437/195 |
| 5,234,864 | * 8/1993 | Kim et al. | 437/197 |
| 5,320,981 | * 6/1994 | Blalock | 437/195 |
| 5,397,742 | * 3/1995 | Kim | 437/190 |
| 5,629,237 | * 5/1997 | Wang et al. | 438/701 |
| 5,912,185 | * 6/1999 | Kwon | 438/698 |
| 5,940,730 | * 8/1999 | Kwak et al. | 438/637 |
| 6,143,666 | * 11/2000 | Lin et al. | 438/725 |
| 6,147,003 | * 11/2000 | Tabara et al. | 438/704 |
| 6,165,870 | * 12/2000 | Shim et al. | 438/424 |
| 6,177,352 | * 1/2001 | Sconfeld | 438/701 |

* cited by examiner

Primary Examiner—Benjamin L. Utech
Assistant Examiner—Charlotte A. Brown
(74) Attorney, Agent, or Firm—W. Wayne Liauh

(57) ABSTRACT

A method for fabricating funnel-shaped vias in semiconductor devices with an improved profile amelioration of the sharp angles at the onset of the via and at the intersection between the wet etch section (i.e., the bowl-shaped section) and the dry etch section (i.e., the straight section). The method includes the following main steps: (1) using PECVD to deposit a base dielectric layer on a wafer; (2) depositing a bottom dielectric layer on the base dielectric layer, the bottom dielectric layer having a first predetermined etch removal rate; (3) depositing at least one profile modifying dielectric layer on the bottom dielectric layer; (4) depositing a top dielectric layer on top of the at least one profile modifying dielectric layer, the top dielectric layer has a second predetermined etch removal rate, wherein the second predetermined etch removal rate is higher than the first predetermined etch removal rate; (5) forming a photoresist layer on the top dielectric layer, the photoresist layer containing an opening so as to allow a via to be formed through the multiplicity of dielectric layers; (6) using a simultaneous wet-and-dry etching process to form a funnel-shaped via in the multiplicity of dielectric layers. The dielectric layer material is selected such that its etch removal rate can be adjusted by adjusting one of the PECVD parameters.

20 Claims, 2 Drawing Sheets ic layer.
METHODS TO MODIFY WET BY DRY ETCHED VIA PROFILE

FIELD OF THE INVENTION

The present invention relates to an improved method, which involves a "wet-by-dry" process (which may also be called a simultaneous "wet-and-dry" process), for making vias in a semiconductor device that are typically formed to connect two conducting layers that separated by a dielectric layer. More specifically, the present invention relates to an improved wet-by-dry etching process (i.e., using simultaneous wet and dry etching processes) for making funnel-shaped (i.e., a tapered or bowl-shaped section above a straight section) vias in a semiconductor device. The present invention also relates to the improved vias fabricated from the novel process of so disclosed. One of the main advantages of the present invention is that vias can be made to have a smooth profile, and that the sharp angles that are typically present between the via and the photoresist and between the wet and dry etched regions, can be substantially ameliorated. Another main advantage of the present invention is that the improved vias can be fabricated without substantially increasing the manufacturing cost or unduly complicating the manufacturing process.

BACKGROUND OF THE INVENTION

In the fabrication of ultra-large-scale integrated (ULSI) circuits, vertical stacking, or integration, of a plurality of metal wiring circuits, or metal layers, to form a multilevel structure has become an efficient way to improve circuit performance and increase the functional complexity of the circuits. The metal wiring circuits are connected by the so-called "vias", which are formed through a dielectric layer sandwiched by two adjacent metal layers.

Vias are formed typically by first forming through holes in the dielectric layer, followed by the deposition of a conductive material into the through holes. In order to improve the step coverage of a subsequent deposition process, especially a sputter deposition process, in the through hole that has been formed in a dielectric layer on top of a conductive layer, the through hole is often formed to have a funnel shape, i.e., a generally straight lower portion and a tapered portion radiating from the mouth of the straight lower portion. Such a funnel shaped through hole is typically formed using a so-called wet-by-dry etch process, by which the dielectric layer is etched using, simultaneously, a wet etch process and a dry etch process. The dry etch process, which is substantially anisotropic, forms a straight passageway in the dielectric layer. The wet etch process, which is substantially isotropic, causing the passageway to be widened in the direction substantially perpendicular to the dry etching direction. As the dry etch progresses, the extent of wet etch accumulates, and the accumulated extent of the wet etch decreases with increased depth into the dielectric, due to decreased wet etch time. Thus, the final result is a funnel shaped via (i.e., through hole) consisting of two sections, a dry etch (i.e., lower) section with a generally uniform width, and a wet etch (i.e., upper) section with a tapered or bowl-shaped width. The width of the wet etch upper section increases from the mouth (i.e., the intersection between the dry etch lower section and the wet etch upper section) to the top surface of the dielectric layer.

One of the disadvantages of the funnel-shaped vias formed with the conventional wet-by-dry process is that the tapered section has a very steep curve-up portion. This can substantially reduce the step coverage efficiency that the funnel-shaped vias are intended to provide. To maximize the step coverage efficiency in a subsequent sputter depositing process, the tapered section should be as smooth as possible, and the steep curve-up portion near the top of the via should be substantially reduced.

Another disadvantage of the funnel-shaped vias formed with the conventional wet-by-dry process is that there exist sharp angles between the dry etch section and the wet etch section, and between the via and the photoresist (which is the also the exit angle of the via at the top dielectric surface). The sharp exit angle is also related to the steep curve-up portion of the tapered section of the via discussed above. These sharp angles can cause some blind spots in the overall fabrication process and result in reduced production yield.

Due to the high degree of competition in the semiconductor industry, it is important to take careful looks at every possible way that may improve production yield. Preferably, such improvement is done in a cost-effective manner.

SUMMARY OF THE INVENTION

The primary object of the present invention is to develop a method to fabricate vias in semiconductor devices with improved profile. More specifically, the primary object of the present invention is to develop a method to fabricate vias with a smoothen tapered section so as to achieve most efficient step coverage in a subsequent sputtering process to fill the via with a conductive material. The vias fabricated using the process of the present invention also eliminate the sharp angles between the wet etch section and the photoresist, and between the wet etch section and the dry etch section.

The method disclosed in the present invention can be summarized as comprising the following main steps:

1. Depositing a bottom dielectric layer on a wafer, the bottom dielectric layer has a first predetermined etch removal rate;
2. Depositing at least one profile modifying dielectric layer on the bottom dielectric layer;
3. Depositing a top dielectric layer on top of the at least one profile modifying dielectric layer, the top dielectric layer has a second predetermined etch removal rate, wherein the second predetermined etch removal rate is higher than the first predetermined etch removal rate;
4. Forming a photoresist layer on the top dielectric layer, the photoresist layer containing an opening so as to allow a via to be formed through the multiplicity of the dielectric layers;
5. Using a simultaneous wet-and-dry etching process to form a funnel-shaped via in the multiplicity of dielectric layers.

Prior to the deposition of the bottom dielectric layer, a base dielectric layer is deposited on the wafer. Generally, the simultaneous wet-and-dry etching process is conducted such that the straight section of the funnel-shaped via is formed in the base dielectric layer, and the tapered section of the funnel-shaped via is formed in the multiplicity of dielectric layers. However, the straight section of the funnel-shaped via can be formed partially into the multiplicity of dielectric layers, and, likewise, the tapered section of the funnel-shaped via can be formed partially into the base dielectric layer. Preferably, the profile modifying dielectric layer has an etch removal rate between the first and second predetermined etch rates. If more than one of the profile modifying dielectric layers are to be used, it is preferred that their etch removal rates increase with increased distance from the wafer. Most preferably, the etch removal rates of all the dielectric layers continuously increase from the bottom to the top layer, so as to obtain a very smooth Normally, it would have involved a relatively tedious and expensive procedure to attempt to deposit such a relatively large number of dielectric layers (i.e., the base dielectric layer, the bottom dielectric layer, the at least profile modifying dielectric layer, and the top dielectric layer) on the wafer. However, another important aspect of the present invention is that the formation of these multiplicity of dielectric layers can be effectuated in a relatively simple manner such that all of the dielectric layers are deposited in the same deposition process, with a minor change in the deposition condition.

More specifically, the present invention can take advantage of an observation that the etch removal rate (both dry and wet) of a dielectric layer deposited using the plasma-enhanced chemical-vapor-deposition (PECVD) process can be adjusted by adjusting one or two of the process parameters, such as the partial pressure of the reaction gas, the RF (radiofrequency) power in generating the plasma, temperature, ratio of gas components, etc. Thus, by selecting a dielectric whose etch removal rate can be controlled by controlling one or more of the process parameters, and then controlling these process parameters accordingly, a composite dielectric layer with the optimum profile of etch removal rate can be cost-effectively formed with the PECVD process, so as to provide a funnel-shaped via with the a smooth profile and without the sharp angles at the top surface and between the straight and the bowl-shaped portion of the via.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a novel method for fabricating funnel-shaped vias in semiconductor devices with an improved profile. The funnel-shaped vias so formed have a smoother tapered section, as well as the absence, or at least the amelioration of the sharp angles at the onset of the via and at the intersection between the wet etch section (i.e., the bowl-shaped section) and the dry etch section (i.e., the straight section), so as to achieve the most efficient step coverage in a subsequent sputtering process to complete the via by filling with a conductive material.

The method disclosed in the present invention can be summarized as comprising the following main steps:

1. Depositing a base dielectric layer on a wafer;
2. Depositing a bottom dielectric layer on the base dielectric layer, the bottom dielectric layer having a first predetermined etch removal rate;
3. Depositing at least one profile modifying dielectric layer on the bottom dielectric layer;
4. Depositing a top dielectric layer on top of the at least one profile modifying dielectric layer, the top dielectric layer has a second predetermined etch removal rate, wherein the second predetermined etch removal rate is higher than the first predetermined etch removal rate;
5. Forming a photoresist layer on the top dielectric layer, the photoresist layer containing an opening so as to allow a via to be formed through the multiplicity of dielectric layers;
6. Using a simultaneous wet-and-dry etching process to form a funnel-shaped via in the multiplicity of dielectric layers.

Figure 1:
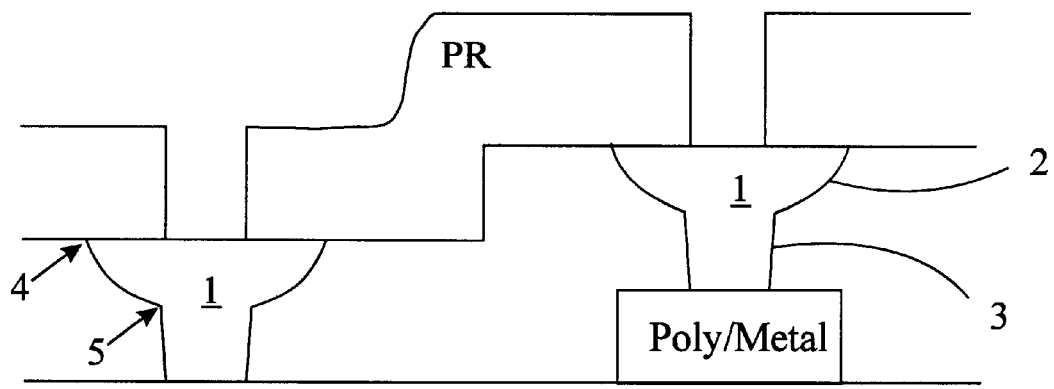
FIG. 1 is an illustrative side view of a funnel-shaped via fabricated according to the conventional method.

FIG. 1 is an illustrative side view of a funnel-shaped via 1 fabricated according to the conventional method. The via 1 contains a bowl-shaped upper section 2 as a result of isotropic wet etch (and dry etch), and a straight lower section 3, formed primarily as a result of anisotropic dry etch. FIG. 1 shows that the slope of the profile in the bowl-shaped upper section 2 increases continuously, resulting in a sharp angle 4 at the exit of the via. FIG. 1 also shows another sharp angle 5 between the bowl-shaped wet etch section 2 and the straight dry etch section 3.

Figure 2:
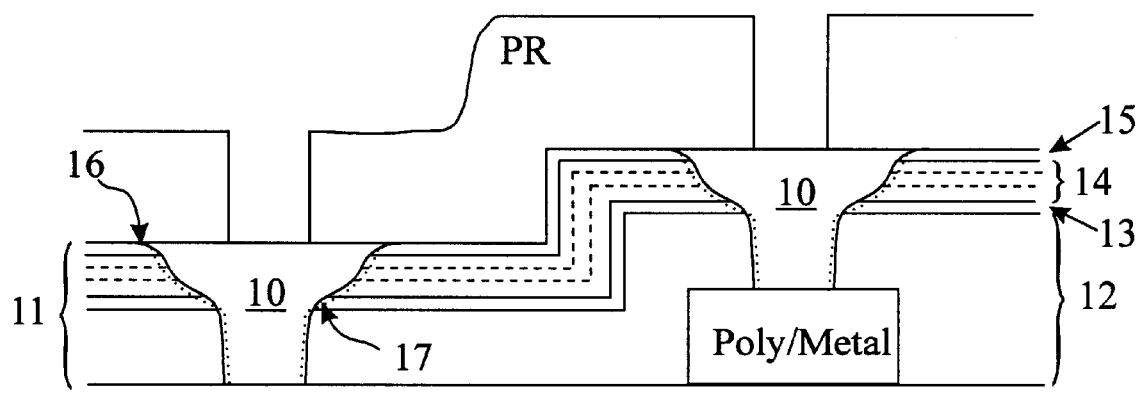
FIG. 2 is an illustrative side view of a funnel-shaped via fabricated according to a preferred embodiment of the method disclosed in the present invention which exhibits smoother profile and amelioration of sharp angles at interfaces.

FIG. 2 is an illustrative side view of a funnel-shaped via fabricated according to a preferred embodiment of the method disclosed in the present invention. The via 10 is formed in a modified, multi-layered dielectric structure 11, which contains a base dielectric layer 12, a bottom dielectric layer 13, a plurality of profile modifying layers 14, and a top dielectric layer 15. FIG. 2 shows that a smoother profile is formed in the via 10, and that the sharp angles 16, 17 at interfaces are substantially ameliorated. While they are described with different designations, the base dielectric layer 12 and the bottom dielectric layer 13 can be merged as a single layer which can be easily achieved by depositing both layers with the same process parameters. The dotted line shows the profile of the via formed using the conventional process.

The multiplicity of dielectric layers above the base layer can also be called, collectively, as the non-base multi-layered dielectric structure. The simultaneous wet-and-dry etching process is conducted such that the straight section of the funnel-shaped via is formed generally in the base dielectric layer, and the bowl-shaped section of the funnel-shaped via is formed generally in the multiplicity of dielectric layers above the base layer (i.e., the non-base dielectric structure). However, the straight section of the funnel-shaped via can be formed partially into the multiplicity of dielectric layers, and, likewise, the bowl-shaped section of the funnel-shaped via can be formed partially into the base dielectric layer. Preferably, the profile modifying dielectric layer has an etch removal rate between the first and second predetermined etch rates. If more than one of the profile modifying dielectric layers are to be used, it is preferred that their etch removal rates increase with increased distance from the wafer. Most preferably, the etch removal rates of all the dielectric layers continuously increase from the bottom to the top layer, so as to obtain a very smooth profile.

In the implementation of the process disclosed in the present invention, it is preferred that the dielectric material is selected such that its etch removal rate can be adjusted by adjusting one or more of the parameters in the plasma-enhanced chemical-vapor-deposition (PECVD) process, such as the partial pressure of the reaction gas, the RF (radiofrequency) power in generating the plasma, temperature, ratio of gas components, etc.

Figure 3:
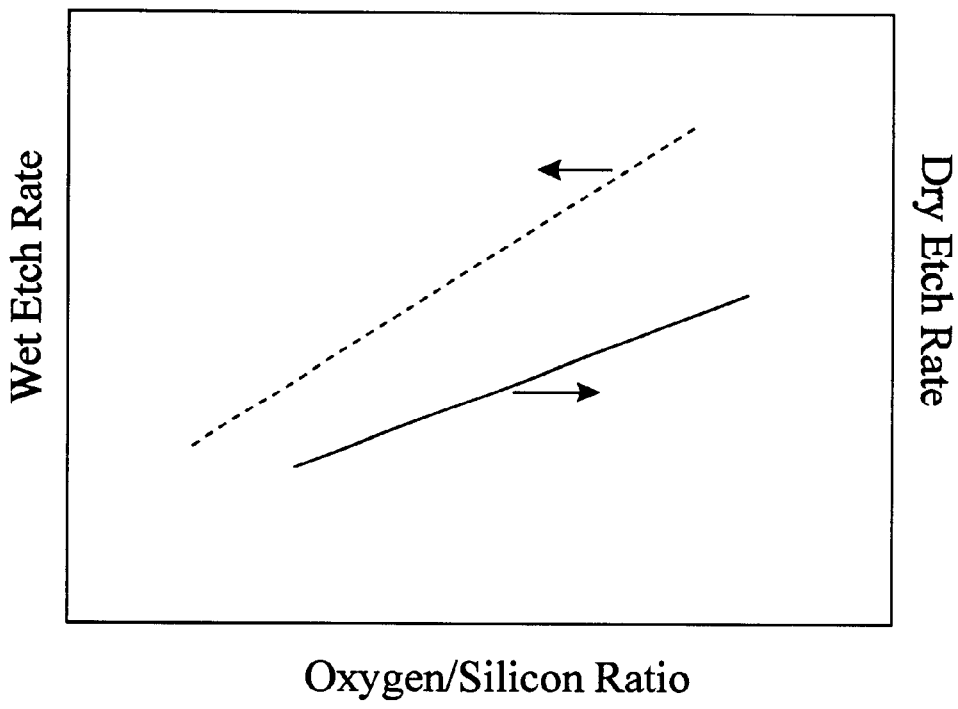
FIG. 3 shows plots of CMP removal rate and wet etch rate, respectively, of silicon oxide vs silicon/oxygen ratio of the PECVD chamber in which the silicon oxide is deposited on a silicon substrate.

As an example of such relationship, FIG. 3 shows plots of dry and wet etch removal rates of TEOS (tetra-ethyl-orthosilicate) vs the oxygen/silicon ratio in the PECVD chamber in which the silicon oxide is deposited on a silicon substrate. Similar dependency can be obtained by adjusting the RF power or by adjusting temperature or the partial pressure of the reaction gas. Thus, by selecting a dielectric material whose etch removal rate can be controlled by controlling one or more of the process parameter, and then controlling these process parameters accordingly, a composite dielectric layer with the optimum profile of etch removal rate can be formed with the PECVD process, so as to provide a funnel-shaped via with the a smooth profile and without the sharp angles at the top surface and at the intersection between the straight and the bowl-shaped portion of the via.

Figure 4:
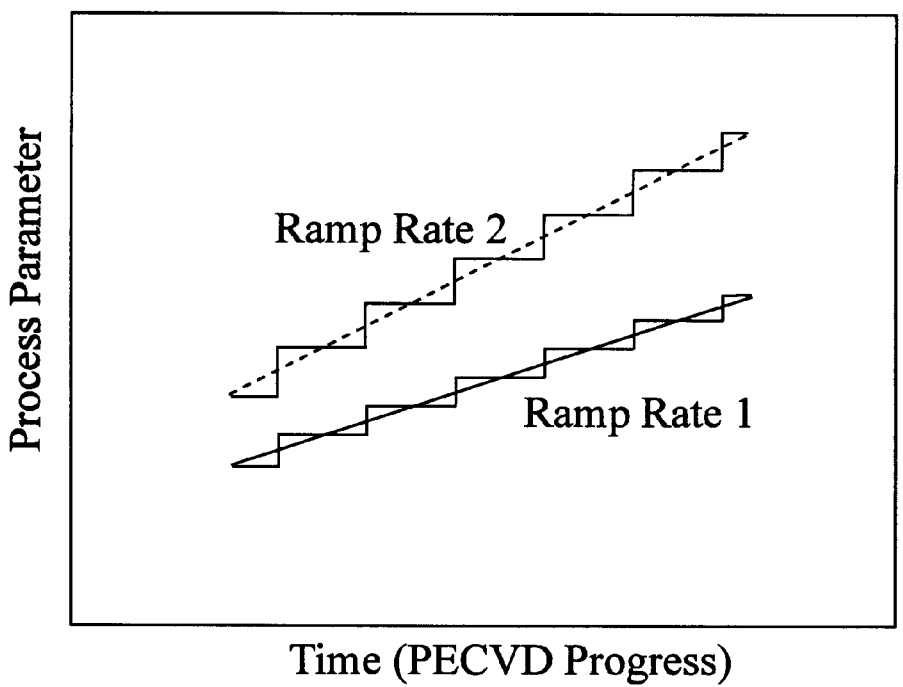
FIG. 4 shows a preferred embodiment of the present invention by using a continuous change in the process parameter during the PECVD process.

Since the present invention does not require large amounts of extra efforts to increase the number of profile modifying dielectric layers, in practical applications, the process condition which is used to control the etch rate of the dielectric layer can be adjusted in an essentially continuous manner, i.e., the process is divided into a large number of steps each step representing a small incremental adjustment over the immediately previous step, so as to form a etch removal rate gradient in the profile modifying dielectric layers. This is illustrated in FIG. 4, in which the process parameter can be the partial pressure of the reaction gas, RF power, temperature, ratio of the gas components, etc. If necessary, a wet dip process can be applied to fine tune the post-etch profile of the via.

The entire profile of the bowl-shaped portion of the via as well as the intersecting angle between the bowl-section and the straight section can be further controlled by adjusting the etch removal rate of the base dielectric. If necessary, the base dielectric can also be formed to also have an etch removal rate gradient, such that the dry etch removal rate decreases with distance from the wafer, to further reduce the intersecting angle between the bowl-section and the straight section of the via. Increasing dry etch removal rate reduces the required dry etch time, and, consequently, the extent of wet etch perpendicular to the direction of dry etch. This results in a reduction in the angle between the bowl-section and the straight section of the via.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A series of TEOS layers were deposited on a wafer by adjusting the gas flow ratio in a PECVD chamber between a silicon-containing component $SiH_4$ and an oxygen-containing component $O_2$ gas. These silicon oxide layers with varying stoichiometry due to the different chemical vapor composition are tested for their etch rate in a $NH_4F$ buffered HF wet chemical etch. The results are summarized in Table 1.

TABLE 1

| TEOS Samples | TEOS-1 | TEOS-2 | TEOS-3 | TEOS-4 | TEOS-5 |
|---|---|---|---|---|---|
| Relative Oxygen/Silicon Ratio in the gas flow (1 being the highest, and 5 the lowest) | 1 | 2 | 3 | 4 | 5 |
| Etch Rate (nm/min) | 898.9 | 433.9 | 332.1 | 301.1 | 273.3 |

As it is shown in Table 1, when the silicon Oxygen/Silicon oxygen ratio was increased in the PECVD process, the etch rate of the resultant TEOS layer also increased. The wafer containing the various TEOS layers is subject to a simultaneous wet-and-dry etch process. A funnel-shaped via is formed which contains a smooth profile in the bowl-shaped section 20 as shown in FIG. 2. FIG. 2 also shows that the width of the straight section (i.e., the dry etch lower section) can be enlarged without affecting the overall width of the wet etch upper section.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method to form a funnel-shaped via in a semiconductor comprising the steps of:
   (a) depositing a base dielectric layer on a wafer;
   (b) depositing a bottom dielectric layer on said base dielectric layer, said bottom dielectric layer having a first etch removal rate;
   (c) depositing at least one profile modifying dielectric layer on said bottom dielectric layer;
   (d) depositing a top dielectric layer on said at least one profile modifying dielectric layer, wherein said top dielectric layer having a second etch removal rate, and said second etch removal rate being greater than said first etch removal rate, further wherein said bottom dielectric layer, said at least one profile modifying dielectric layer and said top dielectric layer being collectively called a non-base dielectric layer;
   (e) conducting a simultaneous wet-and-dry etch process in cooperation with a photoresist to form a funnel-shaped via having a bowl-shaped top section and a generally straight lower section approximately in said non-base dielectric layer and said base dielectric layer, respectively.

2. The method to form a funnel-shaped via in a semiconductor according to claim 1 wherein said step (c) comprises the sub-steps of forming at least two of said profile modifying dielectric layers.

3. The method to form a funnel-shaped via in a semiconductor according to claim 1 wherein all of said dielectric layers are deposited in a common plasma-enhanced chemical-vapor- deposition (PECVD) process.

4. The method to form a funnel-shaped via in a semiconductor according to claim 3 wherein said dielectric layers are deposited from a material whose etch removal rate can be adjusted by adjusting at least one process parameter of said PECVD process.

5. The method to form a funnel-shaped via in a semiconductor according to claim 3 wherein said dielectric layers are deposited from a material whose etch removal rate can be adjusted by adjusting partial pressure of a reaction gas, radiofrequency power, temperature, or ratio of reaction gas components, of said PECVD process.

6. The method to form a funnel-shaped via in a semiconductor according to claim 3 wherein said dielectric layers are TEOS layers which are deposited from a depositing composition containing a silicon-containing component and an oxygen-containing component.

7. The method to form a funnel-shaped via in a semiconductor according to claim 6 wherein silicon-containing component is $SiH_4$ and said oxygen-containing component is $O_2$ gas.

8. The method to form a funnel-shaped via in a semiconductor according to claim 1 wherein said second etch removal is selected such that said via exhibits a decrease in a slope of its profile near its top.

9. The method to form a funnel-shaped via in a semiconductor according to claim 1 wherein said step (c) comprises the sub-steps of forming a plurality of said profile modifying dielectric layers with continuously increasing etch removal rates.

10. The method to form a funnel-shaped via in a semiconductor according to claim 1 wherein said base layer comprises a plurality of sub-layers whose etch removal rate decreases with increased distance from said wafer.

11. A semiconductor device containing a funnel-shaped via formed in a multi-layered dielectric structure, said funnel-shaped via containing a bowl-shaped upper section and a generally straight lower section, and said multi-layered dielectric structure containing a base layer for approximately defining said generally straight lower section and a non-base layer for approximately defining said bowl-shaped upper section, wherein said non-base layer comprises:

(a) a bottom dielectric layer having a first predetermined etch removal rate;

(b) at least one profile modifying dielectric layer deposited on said bottom dielectric layer;

(c) a top dielectric layer deposited on said at least one profile modifying dielectric layer, wherein said top dielectric layer having a second predetermined etch removal rate, and said second predetermined etch removal rate being greater than said first predetermined etch removal rate.

12. The semiconductor device containing a funnel-shaped via according to claim 11 wherein said via comprises at least two of said profile modifying dielectric layers.

13. The semiconductor device containing a funnel-shaped via according to claim 11 wherein all of said dielectric layers are deposited in a common plasma-enhanced chemical-vapor-deposition (PECVD) process.

14. The semiconductor device containing a funnel-shaped via according to claim 13 wherein said dielectric layers are deposited from a material whose etch removal rate can be adjusted by adjusting at least one process parameter of said PECVD process.

15. The semiconductor device containing a funnel-shaped via according to claim 13 wherein said dielectric layers are deposited from a material whose etch removal rate can be adjusted by adjusting partial pressure of a reaction gas, radiofrequency power, temperature, or ratio of reaction gas components, of said PECVD process.

16. The semiconductor device containing a funnel-shaped via according to claim 13 wherein said dielectric layers are TEOS layers which are deposited from a depositing composition containing a silicon-containing component and an oxygen-containing component.

17. The semiconductor device containing a funnel-shaped via according to claim 16 wherein silicon-containing component is $SiH_4$ and said oxygen-containing component is $O_2$ gas.

18. The semiconductor device containing a funnel-shaped via according to claim 11 wherein said second predetermined etch removal is selected such that said via exhibits a decrease in a slope of its profile near its top.

19. The semiconductor device containing a funnel-shaped via according to claim 11 wherein said via comprises a plurality of said profile modifying dielectric layers with continuously increasing etch removal rates.

20. The semiconductor device containing a funnel-shaped via according to claim 11 wherein said base layer comprises a plurality of sub-layers whose etch removal rate decreases with increased distance from said wafer.

* * * * *